(12) United States Patent
Lee et al.

(10) Patent No.: US 10,985,211 B1
(45) Date of Patent: Apr. 20, 2021

(54) EMBEDDED MRAM STRUCTURE AND METHOD OF FABRICATING THE SAME

(71) Applicant: UNITED MICROELECTRONICS CORP., Hsin-Chu (TW)

(72) Inventors: Kuo-Hsing Lee, Hsinchu County (TW); Sheng-Yuan Hsueh, Tainan (TW); Ting-Hsiang Huang, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 7 days.

(21) Appl. No.: 16/699,758

(22) Filed: Dec. 2, 2019

(30) Foreign Application Priority Data

Nov. 8, 2019  (CN) .......................... 201911086243.0

(51) Int. Cl.
*H01L 27/22* (2006.01)
*H01L 43/12* (2006.01)
*H01L 23/538* (2006.01)
*H01L 29/417* (2006.01)

(52) U.S. Cl.
CPC ........ *H01L 27/228* (2013.01); *H01L 23/5386* (2013.01); *H01L 29/41725* (2013.01); *H01L 43/12* (2013.01)

(58) Field of Classification Search
CPC .............. H01L 27/228; H01L 23/5386; H01L 29/41725; H01L 43/12
USPC ......................................................... 257/421
See application file for complete search history.

(56) References Cited

U.S. PATENT DOCUMENTS

| | | | |
|---|---|---|---|
| 10,374,006 B1 | 8/2019 | Chu | |
| 10,497,857 B2 * | 12/2019 | Noh | ...................... G11C 11/161 |
| 2007/0091674 A1 | 4/2007 | Park | |
| 2010/0054027 A1 | 3/2010 | Xia | |
| 2016/0315248 A1 | 10/2016 | Zhu | |
| 2017/0331031 A1 | 11/2017 | Bak | |

* cited by examiner

*Primary Examiner* — Tu-Tu V Ho
(74) *Attorney, Agent, or Firm* — Winston Hsu

(57) ABSTRACT

An embedded MRAM structure includes a substrate divided into a memory cell region and a logic device region. An active area is disposed in the memory cell region. A word line is disposed on the substrate and crosses the active area. A source plug is disposed in the active area and at one side of the word line. A drain plug is disposed in the in the active area and at another side of the word line. When viewing from a direction perpendicular to the top surface of the substrate and taking the word line as a symmetric axis, the source plug is a mirror image of the drain plug.

10 Claims, 10 Drawing Sheets

US 10,985,211 B1

EMBEDDED MRAM STRUCTURE AND METHOD OF FABRICATING THE SAME

BACKGROUND OF THE INVENTION

1. Field of the Invention

The present invention relates to an embedded MRAM (magnetoresistive random access memory) structure and a method of fabricating the same, and more particularly to a method of forming an MRAM structure with a top surface of a source line aligned with a top surface of a second metal layer.

2. Description of the Prior Art

Many modern day electronic devices contain electronic memory configured to store data. Electronic memory may be volatile memory or non-volatile memory. Volatile memory stores data only while it is powered, while non-volatile memory is able to store data when power is removed. MRAM is one promising candidate for next generation non-volatile memory technology. An MRAM cell includes a magnetic tunnel junction (MTJ) unit having a variable resistance, located between two electrodes disposed within back-end-of-the-line (BEOL) metallization layers.

An MTJ unit generally includes a layered structure comprising a reference layer, a free layer and a dielectric barrier in between. The reference layer of magnetic material has a magnetic vector that always points in the same direction. The magnetic vector of the free layer is free, but is determined by the physical dimensions of the element. The magnetic vector of the free layer points in either of two directions: parallel or anti-parallel with the magnetization direction of the pinned layer.

However, conventional fabricating processes of MRAMs still have drawbacks. For example, integrity the standard type MRAMs needs to be improved. Therefore, a new fabricating method of the standard type MRAMs is therefore required in the field.

SUMMARY OF THE INVENTION

In light of the above, the present invention provides a method of fabricating an embedded MRAM structure with a source line and a second metal layer in the logic device region at the same height.

According to a preferred embodiment of the present invention, an embedded MRAM structure includes a substrate divided into a memory cell region and a logic device region. An active area is disposed in the memory cell region. A first word line is disposed on the substrate and crosses the active area. A source plug is disposed in the active area and at one side of the first word line. A drain plug is disposed in the active area and at another side of the first word line, wherein when viewing from a direction perpendicular to a top surface of the substrate and taking the first word line as a symmetric axis, the source plug is a mirror image of the drain plug. A first source metal layer contacts the source plug and a first drain metal layer contacts the drain plug. A first source via plug contacts the first source metal layer and a first drain via plug contacts the first drain metal layer. A source line contacts the first source via plug and a second drain metal layer contacts the first drain via plug, wherein a top surface of the source line is aligned with a top surface of the second drain metal layer. A tungsten plug contacts the second drain metal layer. An MTJ unit contacts the tungsten plug. A third drain via plug contacts the MTJ unit. A bit line contacts the third drain via plug.

According to another preferred embodiment of the present invention, a method of fabricating an embedded MRAM includes providing a substrate divided into a memory cell region and a logic device region. An active area is disposed in the memory cell region and a first word line is disposed on the substrate and crosses the active area. Next, a source plug is formed to contact the active area and is disposed at one side of the first word line. A drain plug is formed to contact the active area and at another side of the first word line, wherein when viewing from a direction perpendicular to a top surface of the substrate and taking the first word line as a symmetric axis, the source plug is a mirror image of the drain plug. Later, the first source metal layer contacting the source plug and a first drain metal layer contacting the drain plug are simultaneously formed. After that, a first source via plug contacting the first source metal layer and a first drain via plug contacting the first drain metal layer are simultaneously formed. Subsequently, a source line contacting the first source via plug and a second drain metal layer contacting the first drain via plug are simultaneously formed, wherein a top surface of the source line is aligned with a top surface of the second drain metal layer. Next, a tungsten plug is formed to contact the second drain metal layer. Later, an MTJ unit is formed to contact the tungsten plug. After that, a third drain via plug is formed to contacting the MTJ unit. Finally, a bit line is formed to contact the third drain via plug.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 8 depict a fabricating method of an embedded MRAM structure according to a preferred embodiment of the present invention, wherein:

FIG. 1 depicts a top view of a substrate with active areas;
FIG. 2 depicts a sectional view respectively taken along a line A-A' and a line B-B' shown in FIG. 1;
FIG. 3 depicts a fabricating stage following FIG. 1;
FIG. 4 depicts a sectional view respectively taken along a line C-C' and a line D-D' in FIG. 3;
FIG. 5 depicts a fabricating stage following FIG. 3;
FIG. 6 depicts a sectional view respectively taken along a line E-E' and a line F-F' in FIG. 5;
FIG. 7 depicts a fabricating stage following FIG. 5;
and
FIG. 8 depicts a sectional view respectively taken a line G-G' and a line H-H' in FIG. 7.

DETAILED DESCRIPTION

Figure 1:
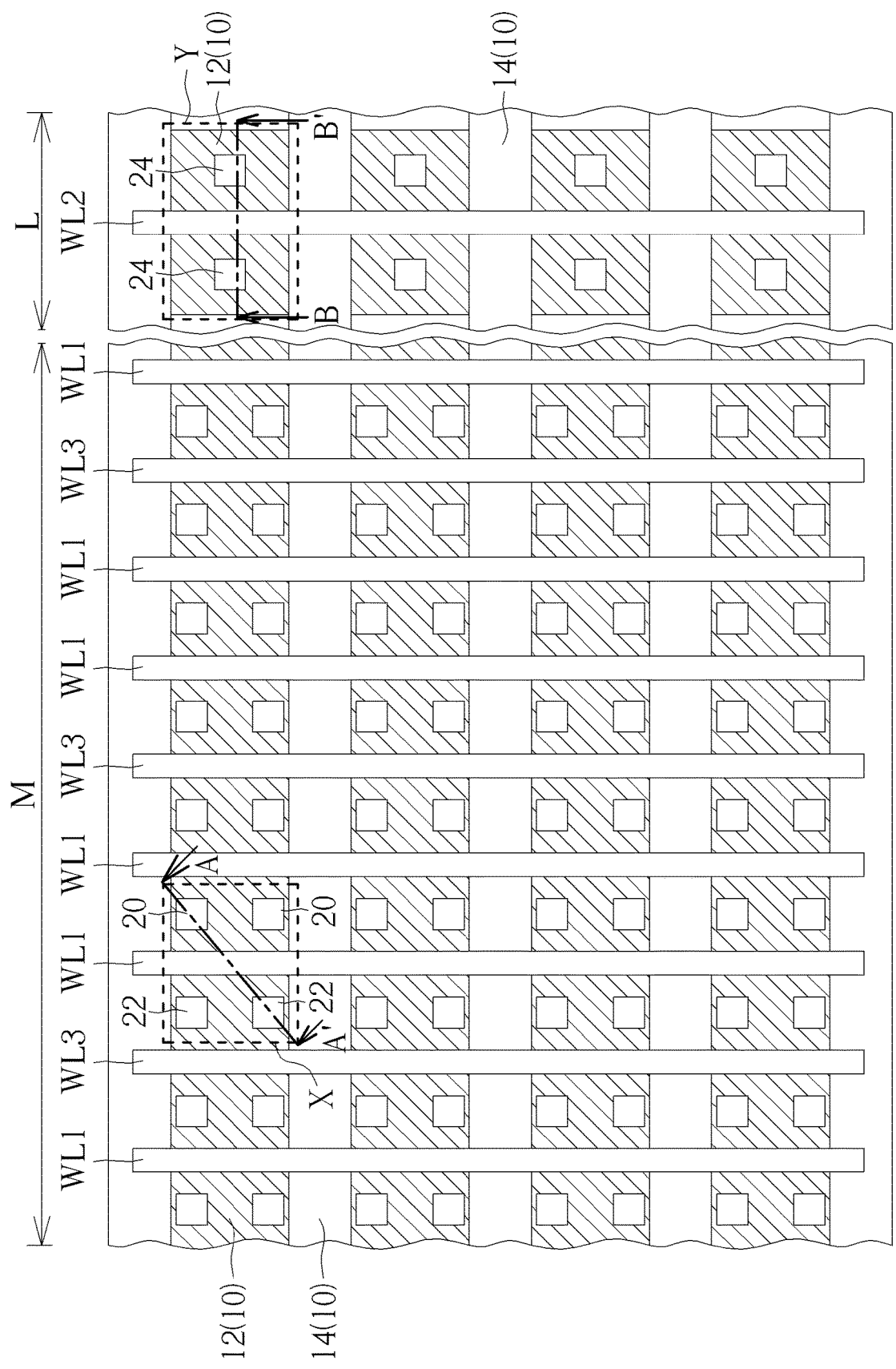
Figure 2:
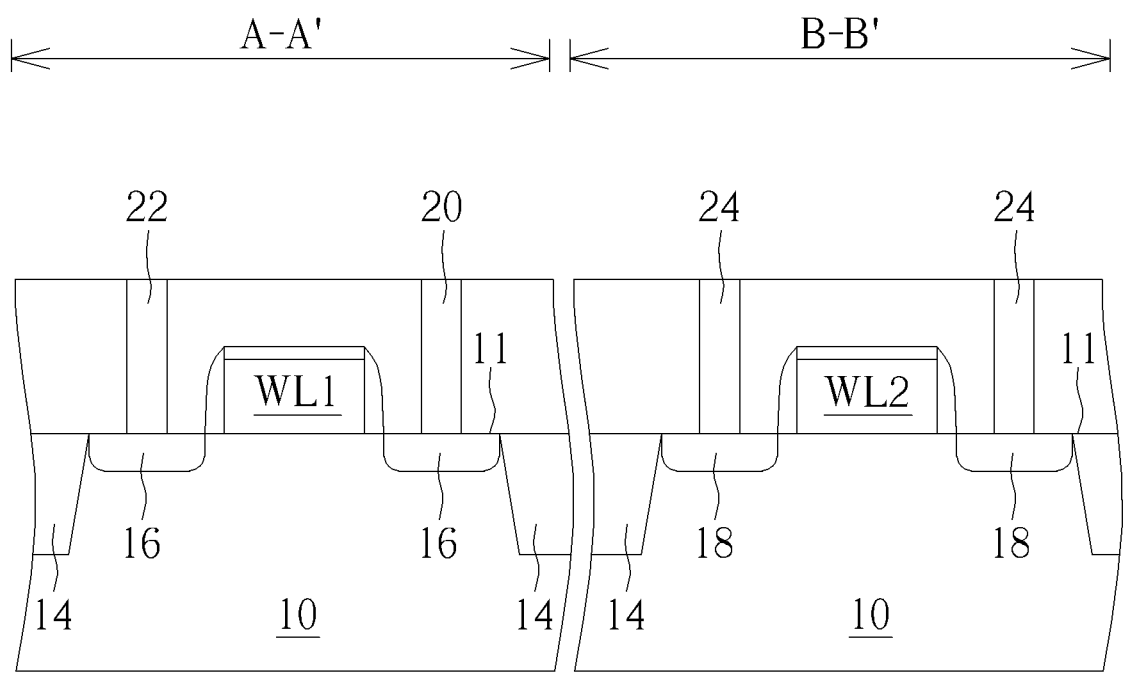

FIG. 1 to FIG. 8 depict a fabricating method of an embedded MRAM structure according to a preferred embodiment of the present invention. FIG. 2 depicts a sectional view respectively taken along a line A-A' and a line B-B' shown in FIG. 1.

As shown in FIG. 1, a substrate 10 is provided. The substrate 10 is divided into a memory cell region M and a logic device region L. Numerous active areas 12 are disposed on the substrate 10. Several insulating layers 14 respectively disposed between active areas 12 to insulate adjacent active areas 12. Moreover, numerous word lines WL1/WL2 are disposed on the substrate 10. Each of the word lines WL1/WL2 crosses the active areas 12. A dummy gate line WL3 can be disposed between the word lines WL1/WL2 based on the circuit layout. Later, P-type or N-type dopants are implanted into two sides of each of the word lines WL1/WL2 and the dummy word line WL3 to form numerous doping regions 16/18. Each of the doping regions 16/18 are within the active areas 12. Several embedded MRAM structures and logic devices will be formed by using numerous word lines WL1/WL2, numerous active areas 12, and numerous doping regions 16/18 mentioned above. The following fabricating process will be described by illustrating a single embedded MRAM structure and a single logic device as an example.

The region X in FIG. 1 indicates a range where a single embedded MRAM structure will be formed later. The region Y indicates a range where a single logic device will be formed later. Please refer to FIG. 1 and FIG. 2. Two source plugs 20 and two drain plugs 22 are formed in the region X simultaneously. Meanwhile, two plugs 24 are formed in the region Y. The source plugs 20 are disposed in the active area 12 within the memory cell region M. The source plugs 20 contact the doping region 16 and are disposed at one side of the word line WL1. The drain plugs are disposed in the active area 12 within the memory cell region M. The drain plugs 22 contact doping region 16 and are disposed at another side of the word line WL1. The plugs 24 are disposed within the logic device region L, contact the doping region 18 and at two sides of the word line WL2. The number of the source plugs 20 can be more than two, and the number of the drain plugs 20 can also be more than two. As shown in FIG. 1 and FIG. 2, when viewing from a direction perpendicular to a top surface 11 of the substrate 10 and taking the word line WL as a symmetric axis, the source plugs 20 are a mirror image of the drain plugs 22. That is, when viewing from the direction perpendicular to the top surface 11 of the substrate 10, the position of the source plugs 20 and the drain plugs 22 are in a symmetric layout by taking the word line WL1 as the symmetric axis.

Figure 9:
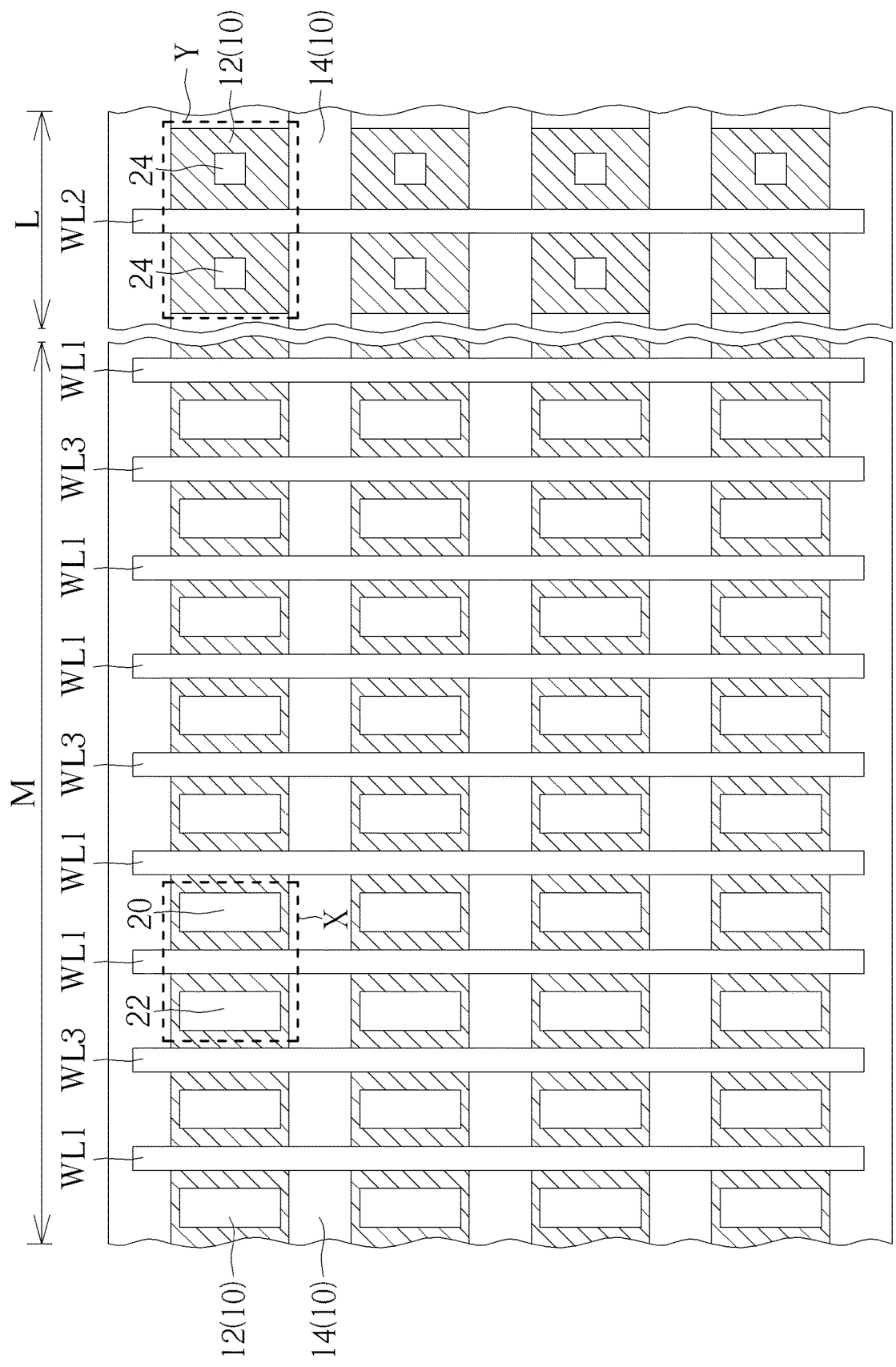
FIG. 9 depicts a layout of source plugs and drain plugs according to another preferred embodiment of the present invention.
Figure 10:
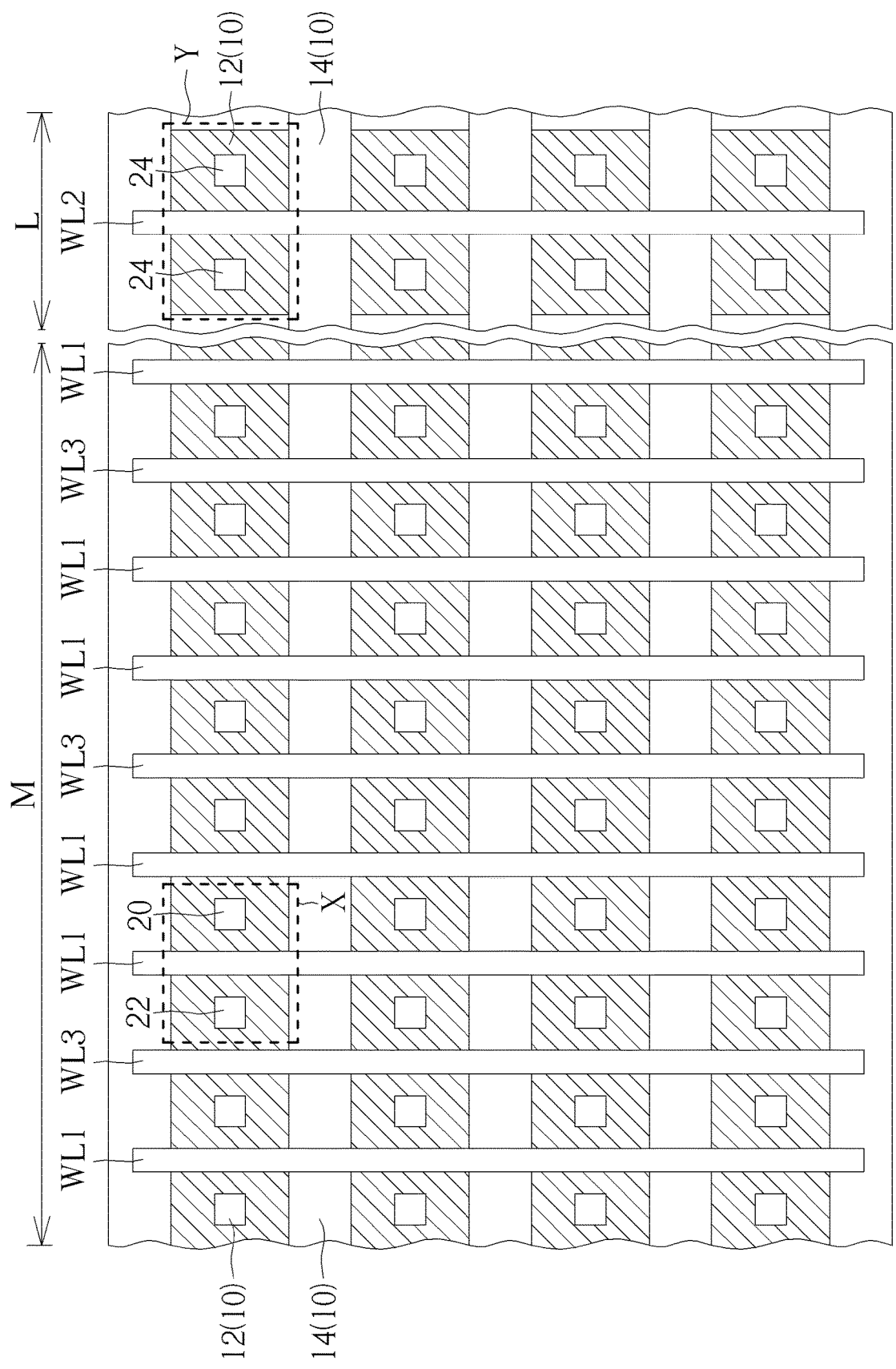
FIG. 10 depicts a layout of source plugs and drain plugs according to yet another preferred embodiment of the present invention.

FIG. 9 depicts a layout of source plugs and drain plugs according to another preferred embodiment of the present invention. FIG. 10 depicts a layout of source plugs and drain plugs according to yet another preferred embodiment of the present invention. Elements in FIG. 9 and FIG. 10 which are substantially the same as those in FIG. 1 are denoted by the same reference numerals; an accompanying explanation is therefore omitted. The modification of FIG. 9 and FIG. 10 with respective to FIG. 1 is the shape and number of the drain plugs and source plugs.

The difference between FIG. 9 and FIG. 1 is that the source plug 20 and the drain plug 22 in FIG. 9 are respectively in a shape of a strip. The occupied area of the single strip-shaped source plug 20 in FIG. 9 is greater than that of the single source plug 20 in FIG. 1. The occupied area of the single strip-shaped drain plug 22 in FIG. 9 is greater than that of the single drain plug 22 in FIG. 1. The difference between FIG. 10 and FIG. 1 is that the numbers of the source plug 20 and the drain plug 22. In FIG. 10, the number of the source plug 20 and the drain plug 22 are both one. However, the size of the source plug 20 in FIG. 10 is the same as the size of source plug 20 in FIG. 1. The size of the drain plug 22 in FIG. 10 is the same as the size of the drain plug 22 in FIG. 1. As shown in FIG. 9 and FIG. 10, when viewing from the direction perpendicular to the top surface 11 (please refer to FIG. 2 for the position of the top surface 11) of the substrate 10 and taking the word line WL1 as a symmetric axis, the source plug 20 is a mirror image of the drain plug 22.

Figure 3:
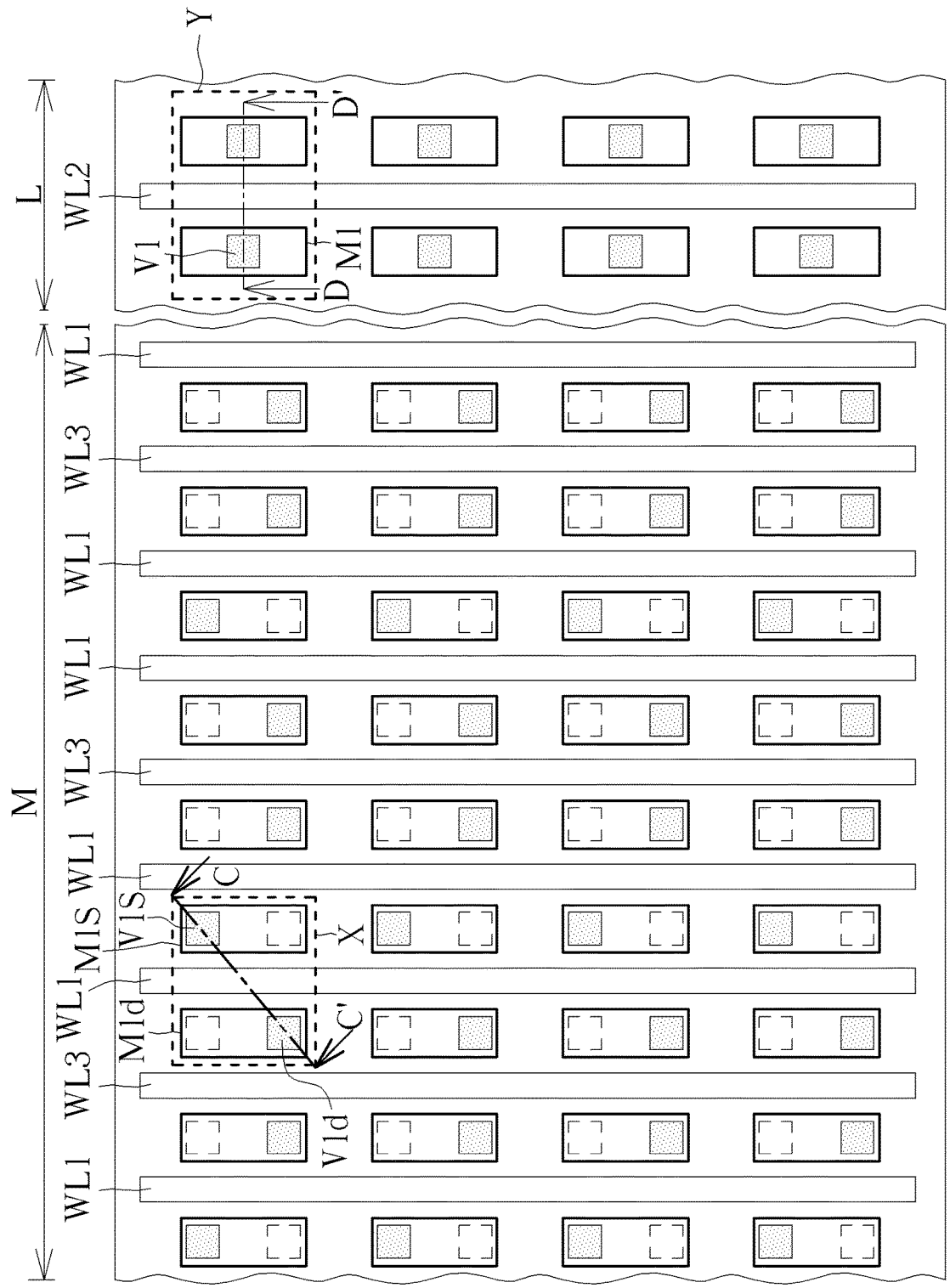
Figure 4:
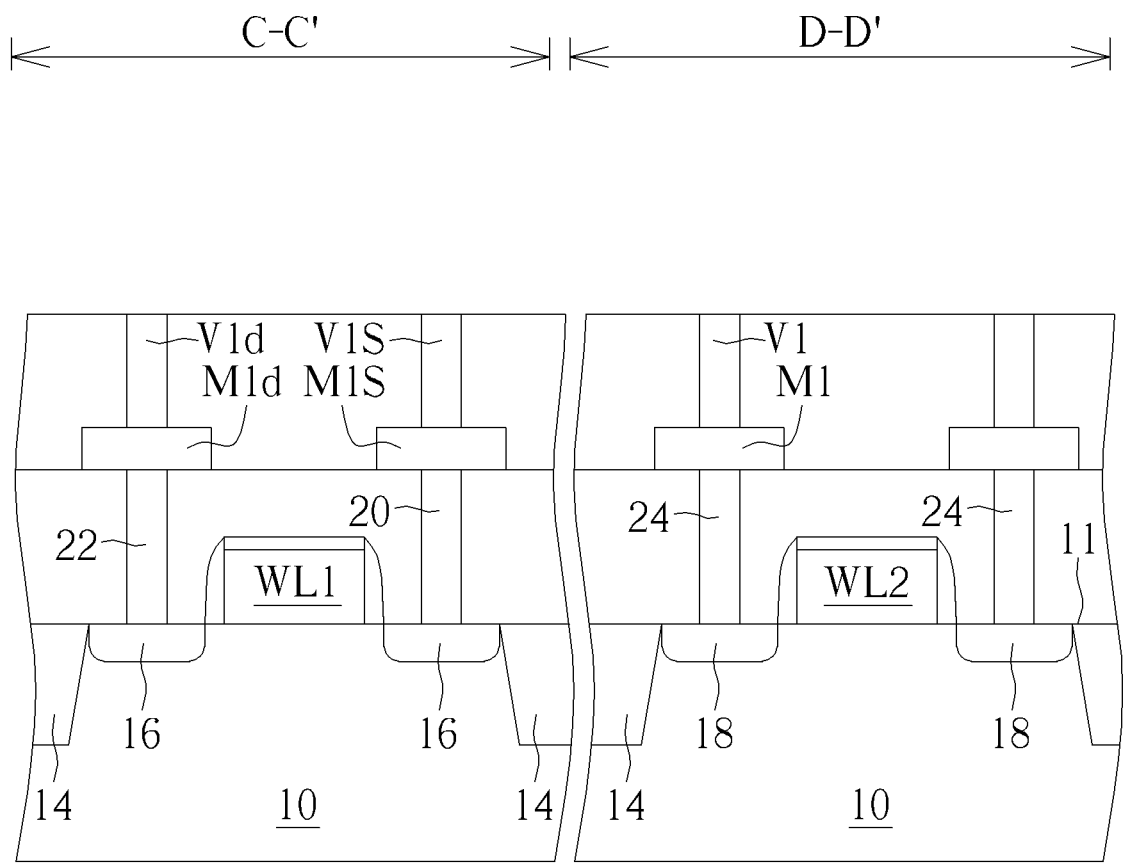

FIG. 3 depicts a fabricating stage following FIG. 1. FIG. 4 depicts a sectional view respectively taken along a line C-C' and a line D-D' in FIG. 3. As shown in FIG. 3 and FIG. 4, a first source metal layer M1S contacting the source plugs 20 and a first drain metal layer M1d contacting drain plugs 22 are simultaneously formed within the memory cell region M. Meanwhile, a first metal layer M1 contacting plug 24 is formed in the logic device region L. In other words, the first source metal layer M1S, the first drain metal layer M1d, and the first metal layer M1 are formed by the same metal deposition process such as a copper damascene process. The top surface of the first source metal layer M1S, the top surface of the first drain metal layer M1d and the top surface of the first metal layer M1 are aligned. Later, a first drain via plug V1S contacting the first source metal layer M1S and a drain via plug V1d contacting the first drain metal layer M1d are simultaneously formed in the memory cell region M. Meanwhile, a first via plug V1 contacting the plug 24 is formed in the logic device region L. The first drain via plug V1S, the drain via plug V1d, and the first via plug V1 are formed by the same metal deposition process such as a copper damascene process. Moreover, as shown in FIG. 3, when viewing from a direction perpendicular to the top surface 11 (please refer to FIG. 2 for the position of the top surface 11) of the substrate 10 and taking the word line WL1 as a symmetric axis, the first source via plug V1S and the first drain via plug V1d are in an asymmetric layout.

Figure 5:
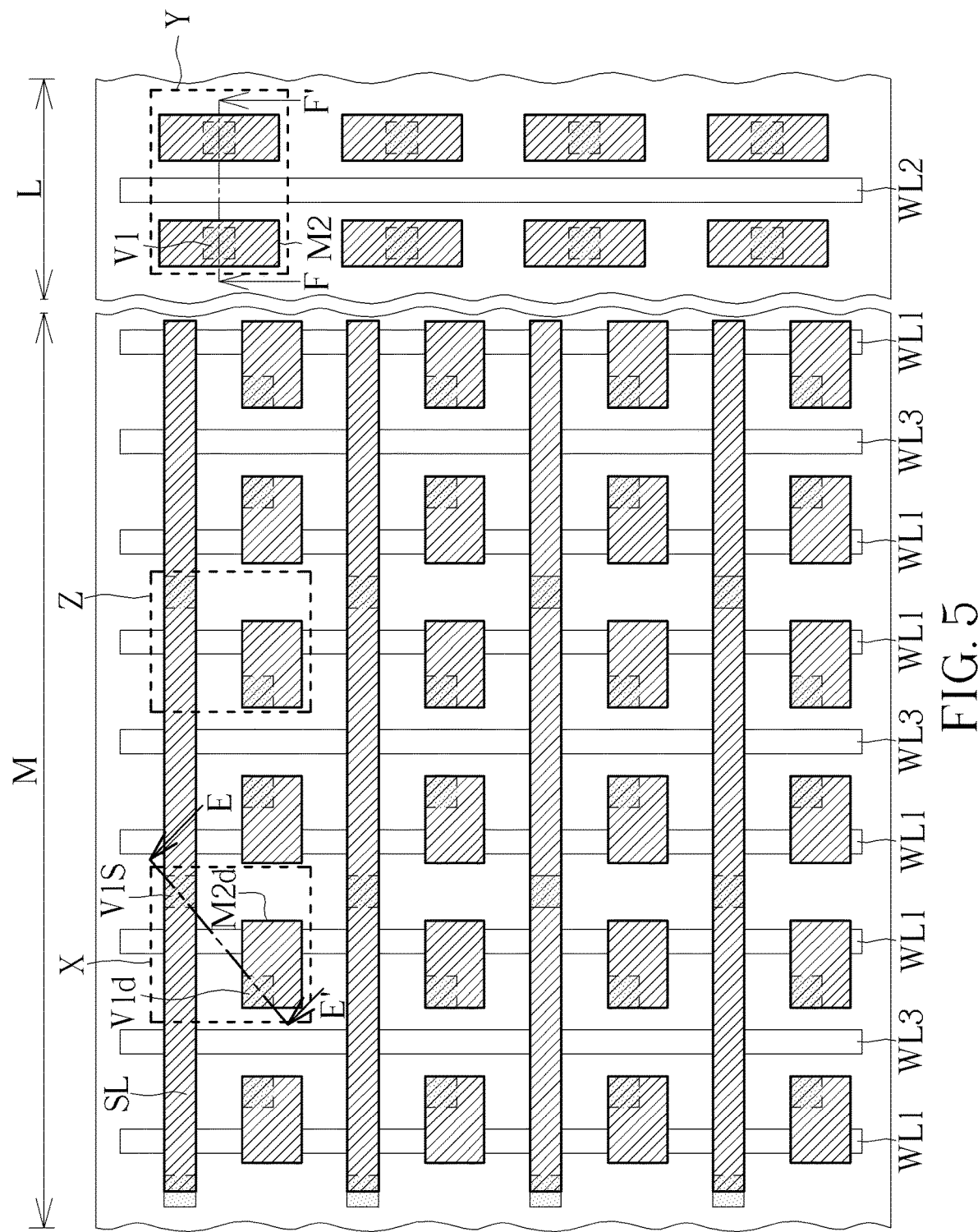
Figure 6:
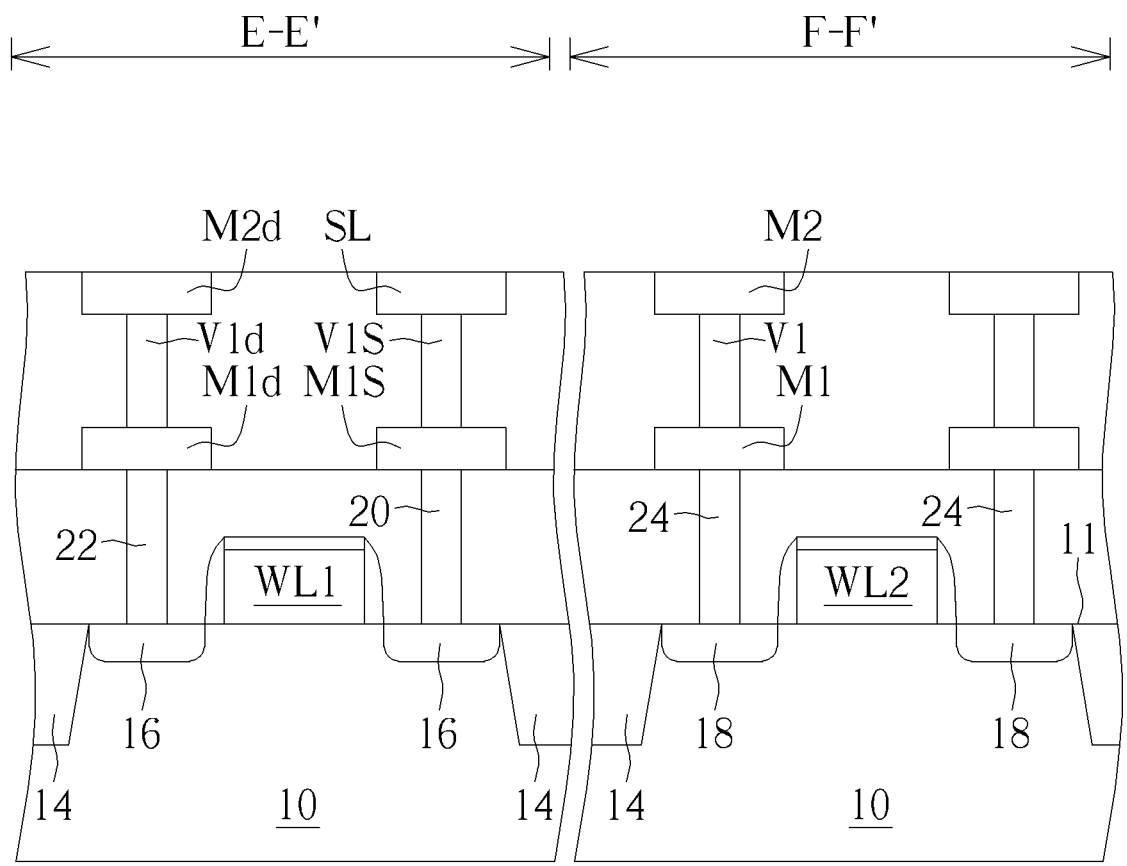

FIG. 5 depicts a fabricating stage following FIG. 3. FIG. 6 depicts a sectional view respectively taken along a line E-E' and a line F-F' in FIG. 5. As shown in FIG. 5 and FIG. 6, a source line SL and a second drain metal layer M2d are simultaneously formed in the memory cell region M. Meanwhile, a second metal layer M2 is formed to contact the first via plug V1 within the logic device region L. The source line SL contacts the first source via plug V1S. The second drain metal layer M2d contacts the first drain via plug V1d. The top surface of the source line SL, the top surface of the second drain metal layer M2d and the top surface of the second metal layer M2 are aligned. The source line SL, the second drain metal layer M2d, and the second metal layer M2 are formed by the same metal deposition process such as a copper damascene process. Please refer to FIG. 5, the source line SL electrically connects to numerous embedded MRAMs. For example, the source line SL electrically connects to the MRAM disposed in the region X and the MRAM disposed in the region Z. In details, each of the MRAMs has the same structure as that of the MRAM in the region X, therefore the source line SL directly contacts the first via plugs V1S respectively in different MRAMs but in the same row.

Figure 7:
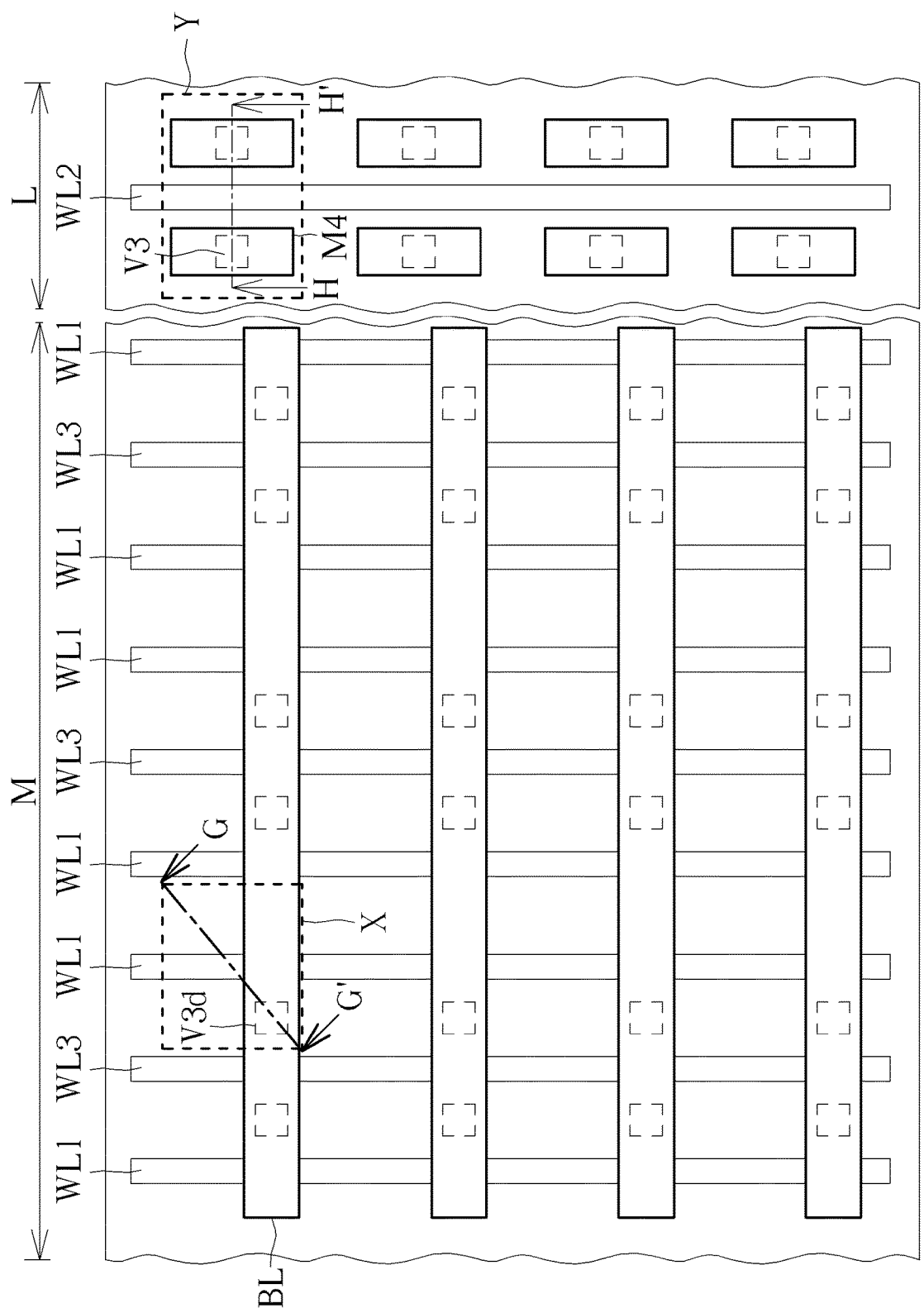
Figure 8:
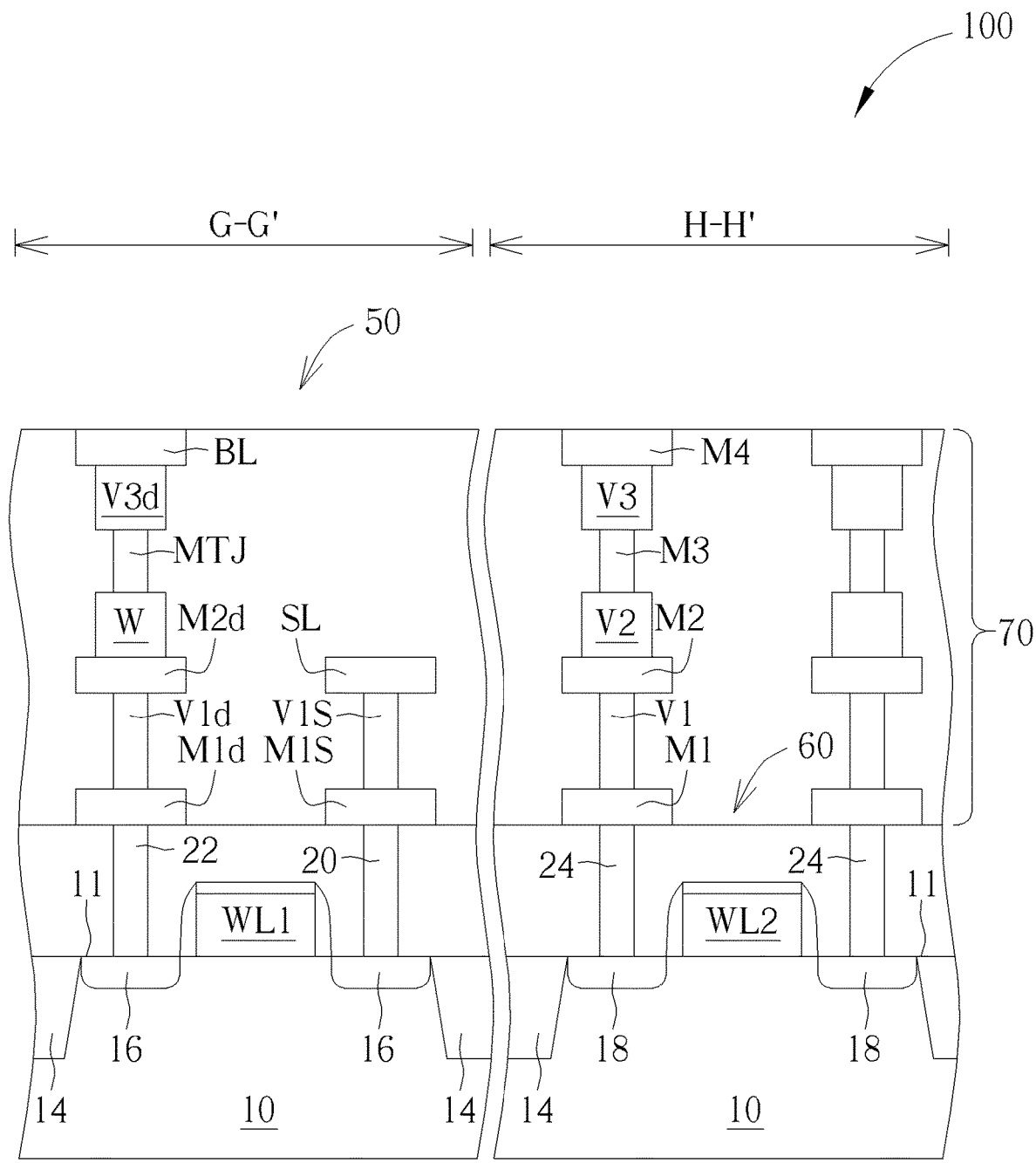

FIG. 7 depicts a fabricating stage following FIG. 5. FIG. 8 depicts a sectional view respectively taken a line G-G' and a line H-H' in FIG. 7. As shown in FIG. 7 and FIG. 8, a tungsten plug W contacting the second drain metal layer M2d is formed in the memory cell region M. A second via plug V2 contacting the second metal layer M2 is formed within the logic device region L. A top surface of the tungsten plug W is aligned with a top surface of the second via plug V2. Later, a MTJ unit is formed contacting the tungsten plug W is formed in the memory cell region M. A third metal layer M3 contacting the second via plug V2 is formed in the logic device region L. Next, a third drain via plug V3d and a third via plug V3 are simultaneously formed. The third drain via plug V3d contacts the MTJ unit MTJ. The third via plug V3 contacts the third metal layer M3. The drain via plug V3d and the third via plug V3 are formed by the same metal deposition process such as a copper damascene process. A top surface of the third drain via plug V3d and a top surface of the third via plug V3 are aligned.

Later, a bit line BL is formed in the memory cell region M and a fourth metal layer M4 is formed in the logic device region L. The bit line BL and the fourth metal layer M4 are formed simultaneously. The bit line BL contacts the third drain via plug V3d, and the fourth metal layer M4 contacts the third via plug V3. A top surface of the fourth metal layer M4 and a top surface of the bit line BL are aligned. Now, an MRAM structure 100 of the present invention is completed.

FIG. 7 depicts an embedded MRAM structure according to a preferred embodiment of the present invention. FIG. 8 depicts a sectional view respectively taken along a line G-G' and a line H-H' in FIG. 7. FIG. 1 depicts a top view of an active area, a word line, a source plug and a drain plug of an embedded MRAM structure of the present invention.

As shown in FIG. 7, an embedded MRAM structure 100 includes a substrate 10. The substrate 10 is divided into a memory cell region M and a logic device region L. Numerous active areas 12 are disposed in the memory cell region M and the logic device region L (please refer to FIG. 1 for the positions of the active areas 12). Numerous word lines WL1/WL2 are disposed on the substrate 10 and cross the active areas 12. As shown in FIG. 7, numerous embedded MRAM structures which having the structure as that of the embedded MRAM structure 50 in FIG. 8, and numerous logic devices 60 which having the structure as that of the logic device 60 in FIG. 8 are disposed on the substrate 10. The embedded MRAM structure 50 in FIG. 8 is disposed in the region X in FIG. 7, and the logic device 60 in FIG. 8 is disposed in the region Y in FIG. 7. In the following description, a single embedded MRAM structure 50 and a single logic device 60 are illustrated as example. Please refer to the region X in FIG. 1 and FIG. 8. At least one source plug 20 contacts the active area 12 and is disposed at one side of the word line WL1. At least one drain plug 22 contacts the active area 12 and is disposed at another side of the word line WL1. When viewing from a direction perpendicular to a top surface 11 of the substrate 10 and taking the word line WL1 as a symmetric axis, the source plug 20 are mirror images of the drain plug 22. The numbers of the source plug 20 and the drain plug 22 are exemplified as two in FIG. 1. Moreover, as shown in FIG. 10, the number of the source plug 20 and the drain plug 22 can be changed to one respectively. Based on different requirements, as shown in FIG. 9, the shapes of the source plug 20 and the drain plug 22 can be respectively changed into a strip.

As shown in FIG. 8, the embedded MRAM structure 50 further includes a first source metal layer M1S contacting the source plug 20 and a first drain metal layer M1d contacting the drain plug 22. A first drain via plug V1S contacts the first source metal layer M1S and a drain via plug V1d contacts the first drain metal layer M1d. The source line SL contacts the first source via plug V1S. The second drain metal layer M2d contacts the first drain via plug V1d. The top surface of the source line SL and the top surface of the second drain metal layer M2d are aligned. A tungsten plug W contacts the second drain metal layer M2d. A MTJ unit MTJ contacts the tungsten plug W. A third drain via plug V3d contacts the MTJ unit MTJ. A bit line BL contacts the third drain via plug V3d. In detail, the drain plug 22, the first drain metal layer M1d, the first drain via plug V1d, the second drain metal layer M2d, the tungsten plug W, the MTJ unit MTJ, the third drain via plug V3d and the bit line BL are stacked from bottom to top. The source plug 20, the first source metal layer M1S, the first source via plug V1S and the source line SL are stacked from bottom to top. The first drain metal layer M1d, the first drain via plug V1d, the second drain metal layer M2d, the third drain via plug V3d, the bit line BL, the first source metal layer M1S, the first source via plug V1S and the source line SL includes copper. The drain plug 22 and the source plug 20 include aluminum.

As shown in FIG. 7 and FIG. 8, the embedded MRAM structure 100 further includes numerous logic devices and numerous metal interconnections disposed within the logic device region L. In the following description, a logic device 60 within the region Y and a metal interconnection 70 are illustrated as example. The logic device 60 includes a word line WL2 disposed on the substrate 10. A doping region 18 is disposed in the substrate 10 at one side of the second word line WL2. A plug 24 contacts the doping region 18. The metal interconnection 70 includes a first metal layer M1 contacting the plug 24, a first via plug V1 contacting the first metal layer M1, a second metal layer M2 contacting the first via plug V1, a second via plug V2 contacting the second metal layer M2, a third metal layer M3 contacting the second via plug V2, a third via plug V3 contacting the third metal layer M3, a fourth metal layer M4 contacting the third via plug V3. A top surface of the second metal layer M2 is aligned with the top surface of the source line S. A top surface of the second via plug V2 is aligned with a top surface of the tungsten plug W. A top surface of the third metal layer M3 is aligned with a top surface of the MTJ unit MTJ. A top surface of the fourth metal layer M4 is aligned with a top surface of the bit line BL. The first metal layer M1, the first via plug V1, the second metal layer M2, the second via plug V2, the third metal layer M3, the third via plug V3, the fourth metal layer M4 includes copper. The plug 24 includes aluminum.

The source line in the present invention is disposed at the same height as that of the second metal layer in the logic device region. In this way, the source plug and the drain plug of the embedded MRAM structure can be arranged in a symmetric layout. On the other hand, regarding the MRAM structure with the source line disposed at the same height as that of the first metal layer, the source plug and the drain plug need to be arranged in an asymmetric layout. As a result, the symmetric layout in the present invention can increase the integrity of the embedded MRAM structure.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. An embedded MRAM structure, comprising:
   a substrate divided into a memory cell region and a logic device region;
   an active area disposed in the memory cell region;
   a first word line disposed on the substrate and crossing the active area;
   a source plug disposed in the active area and at one side of the first word line;
   a drain plug disposed in the active area and at another side of the first word line, wherein when viewing from a direction perpendicular to a top surface of the substrate and taking the first word line as a symmetric axis, the source plug is a mirror image of the drain plug;
a first source metal layer contacting the source plug and a first drain metal layer contacting the drain plug;
a first source via plug contacting the first source metal layer and a first drain via plug contacting the first drain metal layer;
a source line contacting the first source via plug and a second drain metal layer contacting the first drain via plug, wherein a top surface of the source line is aligned with a top surface of the second drain metal layer;
a tungsten plug contacting the second drain metal layer;
an MTJ unit contacting the tungsten plug;
a third drain via plug contacting the MTJ unit; and
a bit line contacting the third drain via plug.

2. The embedded MRAM structure of claim 1, wherein the source plug and the drain plug are respectively in a shape of a strip.

3. The embedded MRAM structure of claim 1, further comprising a plurality of the source plugs disposed within the active area, and a plurality of the drain plugs disposed within the active area.

4. The embedded MRAM structure of claim 1, further comprising a logic device and a metal interconnection disposed within the logic device region, wherein the logic device comprises a second word line disposed on the substrate, a doping region disposed in the substrate at one side of the second word line, a plug contacting the doping region, wherein the metal interconnection comprises a first metal layer contacting the plug, a first via plug contacting the first metal layer, a second metal layer contacting the first via plug, a second via plug contacting the second metal layer, a third metal layer contacting the second via plug, a third via plug contacting the third metal layer, a fourth metal layer contacting the third via plug, and wherein a top surface of the second metal layer is aligned with the top surface of the source line, a top surface of the second via plug is aligned with a top surface of the tungsten plug, a top surface of the third metal layer is aligned with a top surface of the MTJ unit, a top surface of the fourth metal layer is aligned with a top surface of the bit line.

5. The embedded MRAM structure of claim 1, wherein the drain plug, the first drain metal layer, the first drain via plug, the second drain metal layer, the tungsten plug, the MTJ unit, the third drain via plug and the bit line are stacked from bottom to top.

6. The embedded MRAM structure of claim 1, wherein the source plug, the first source metal layer, the first source via plug and the source line are stacked from bottom to top.

7. The embedded MRAM structure of claim 1, wherein the first drain metal layer, the first drain via plug, the second drain metal layer, the third drain via plug, the bit line, the first source metal layer, the first source via plug and the source line comprises copper.

8. A method of fabricating an embedded MRAM, comprising:
providing a substrate divided into a memory cell region and a logic device region, an active area disposed in the memory cell region, a first word line disposed on the substrate and crossing the active area;
forming a source plug contacting the active area and disposed at one side of the first word line and forming a drain plug contacting the active area and at another side of the first word line, wherein when viewing from a direction perpendicular to a top surface of the substrate and taking the first word line as a symmetric axis, the source plug is a mirror image of the drain plug;
simultaneously forming the first source metal layer contacting the source plug and a first drain metal layer contacting the drain plug;
simultaneously forming a first source via plug contacting the first source metal layer and a first drain via plug contacting the first drain metal layer;
simultaneously forming a source line contacting the first source via plug and a second drain metal layer contacting the first drain via plug, wherein a top surface of the source line is aligned with a top surface of the second drain metal layer;
forming a tungsten plug contacting the second drain metal layer;
forming an MTJ unit contacting the tungsten plug;
forming a third drain via plug contacting the MTJ unit; and
forming a bit line contacting the third drain via plug.

9. The method of fabricating an embedded MRAM of claim 8, further comprising a logic device disposed within the logic device region, wherein the logic device comprises a second word line disposed on the substrate, a doping region disposed in the substrate at one side of the second word line.

10. The method of fabricating an embedded MRAM of claim 9, further comprising forming a metal interconnection within the logic device region, wherein steps of forming the metal interconnection comprises:
while forming the first drain metal layer, simultaneously forming a first metal layer in the logic device region to contact a plug, wherein the plug contacts the doping region;
while forming the first drain via plug, simultaneously forming a first via plug in the logic device region to contact the first metal layer;
while forming the second drain metal layer, simultaneously forming a second metal layer to contact the first via plug;
forming a second via plug in the logic device region to contact the second metal layer;
forming a third metal layer in the logic device region to contact the second via plug;
while forming the third drain via plug, simultaneously forming a third via plug in the logic device region to contact the third metal layer; and
while forming the bit line, simultaneously forming a fourth metal layer in the logic device region to contact the third via plug, wherein a top surface of the fourth metal layer is aligned with a top surface of the bit line.

* * * * *